DISTORTION REDUCING CIRCUIT

Filed Nov. 9, 1964 2 Sheets-Sheet 1

INVENTORS
ALEXANDER PETER TREU
Edward E PASCAL
BY Curphey & Erickson
PATENT AGENTS

Feb. 20, 1968 A. P. TREU ET AL 3,370,248

DISTORTION REDUCING CIRCUIT

Filed Nov. 9, 1964 2 Sheets-Sheet 2

INVENTORS
ALEXANDER PETER TREU
Edward E PASCAL

BY Curphey & Erickson
PATENT AGENTS

United States Patent Office 3,370,248
Patented Feb. 20, 1968

3,370,248

DISTORTION REDUCING CIRCUIT

Alexander Peter Treu, Ottawa, Ontario, and Edward E. Pascal, Chomedey, Quebec, Canada, assignors to Northern Electric Company Limited, Montreal, Quebec, Canada Filed Nov. 9, 1964, Ser. No. 409,632
15 Claims. (Cl. 330—149)

ABSTRACT OF THE DISCLOSURE

This invention is a circuit for amplifying a signal while cancelling any distortion caused by the stage without requiring total signal feedback. A sample of the input signal is subtracted by passive circuit elements such as by transformer, from a sample of the output signal. Any difference, which amounts to distortion caused by any non-linearity within the stage is applied the control element in the active valve within the stage, thus remodulating the signal traversing the stage during amplification in such direction as to cancel the effects of such non-linearity.

This invention relates to a circuit for reducing distortion in amplifiers, and is particularly useful in amplifiers of modulated carrier frequency signals.

A perfect linear amplifier is one in which the result of amplification, for instance an output signal, is an exact amplified duplication of an input signal. In practice, this ideal can only be approached, since the output vs. input characteristic, or transfer function, of the amplifier is never perfectly linear.

A designer of an amplifying circuit must often have regard for the non-linear portion of the transfer function of his circuit. This non-linearity gives rise to frequency components in the output signal which were not present in the input signal. This problem of non-linearity becomes very important in amplifiers of amplitude-modulated carrier signals which are to be transmitted. In this case, non-linearity causes the addition of undesirable frequency components to the sidebands of the carrier signal, causing a waste in power and spectrum space, and the reception of these undesirable frequencies in a receiver. The problem becomes especially acute in the single-sideband system amplifiers. In this field great efforts are often made to delete unnecessary frequencies, as well as to conserve power.

Until now, various techniques have been used to make the transfer characteristics of an amplifier more linear. For instance, amplifiers are sometimes used over a small portion of their transfer characteristics which allows the approach to, but does not completely achieve, linearity. In these cases, an excessive number of stages are required to produce the total required amplification. Other methods for reduction of distortion are described in Electronic Technology, January 1960, pp. 13–20; Electronics, August 1955, pp. 124–125; and in Proceeding of the IRE, December 1956, pp. 1760–1765. The methods described in the latter article are the use of negative feedback, modulation envelope-distortion cancellation, and a combination of the two.

As explained in the latter aforementioned article, the amount of feedback that can be safely used to reduce distortion depends on the phase-gain characteristics of the feedback loop. This introduces a distortion reduction limiting factor, since excessive phase change can cause instability. In addition, the use of feedback introduces an undesirable reduction of gain in the amplifier stages around which it is used.

The modulation envelope-distortion cancellation method description in that article shows that until now, distortion reduction was attempted over a number of stages in cascade. In an amplifier system comprising a number of stages, the modulation component, or envelope, of the input signal to the system was detected. This was applied to a differential amplifier along with the detected envelope of the output signal of the system. A signal corresponding to the difference between the two envelopes, the distortion components, was derived from the differential amplifier and applied to an audio or modulation amplifier which presented it in suitable form to an amplifier in the system for modulation of the signal traversing therethrough. Because of the multiplicity of tuned circuits and other reactive components in the system, the detected modulation component of the input signal did not exactly correspond in phase with the modulation component of the output signal. Therefore, when the difference between the signals was applied to the differential amplifier, a difference correction signal comprised not only of distortion components, but also of the undesirable phase-difference components was produced, which generated additional distortion which remodulated the principal signal.

In addition, in the past a differential amplifier as well as an audio or modulation amplifier was required for the correction signal which in itself, due to its inherent non-linearity, imposed a phase difference between the correction signal and the component of the principal signal which was to be corrected; thus generating additional distortion components.

We have invented a method of cancellation of distortion within a single stage of amplification, which allows the use of the maximum amplification capacity of the stage. Due to the fact that the generation of the differential signal, and the modulation as well as the detection of the input and output signals is accomplished within a single stage, my invention does not cause the generation of an objectional amount of distortion components due to phase differences of the samples of the output and input signals used to obtain the differential. Because there is no effective feedback except for the distortion component of the signal, there is effectively no gain reduction from the maximum capability of the stage. My invention also achieves a large reduction of circuit elements over the distortion cancellation method described in the aforementioned article.

My invention is a circuit for reducing distortion within a single amplifier stage comprising a single amplifier valve, a single input circuit and a signal output circuit connected to the amplifier valve, subtracting means within said stage, a first detecting means connected to the signal input circuit for detecting a first sample of a modulation component of the input signal, a second detecting means connected to the signal output circuit for detecting a second sample of the modulation component of the output signal, and applying it to the subtracting means; the amplitude of said second sample being such that its effect in the subtracting means is substantially equal to the effect of the sample of the input signal in the absence of distortion which may be caused by a non-linear circuit element which may be connected in the signal path between the signal input circuit and the signal output circuit, and modulating means within the amplifier valve for modulating a signal, traversing the valve from said input circuit to said output circuit, with the difference between the effects of said samples in such manner as to decrease non-linear distortion of the input signal, the subtracting means comprising an arrangement of passive circuit elements connected to the modulating means. Thus, if no distortion is present, the effects of the two samples will be virtually identical and will virtually cancel. However, if the effect of one sample should differ from the effect of the other due to the introduction of distortion within the stage, the difference, or distortion component, between the effects of the two samples modulates the input signal within the valve so as to provide a virtually distortionless output signal.

In order to better understand my invention, reference should be made to the drawings as follows.

Figures 1, 2:
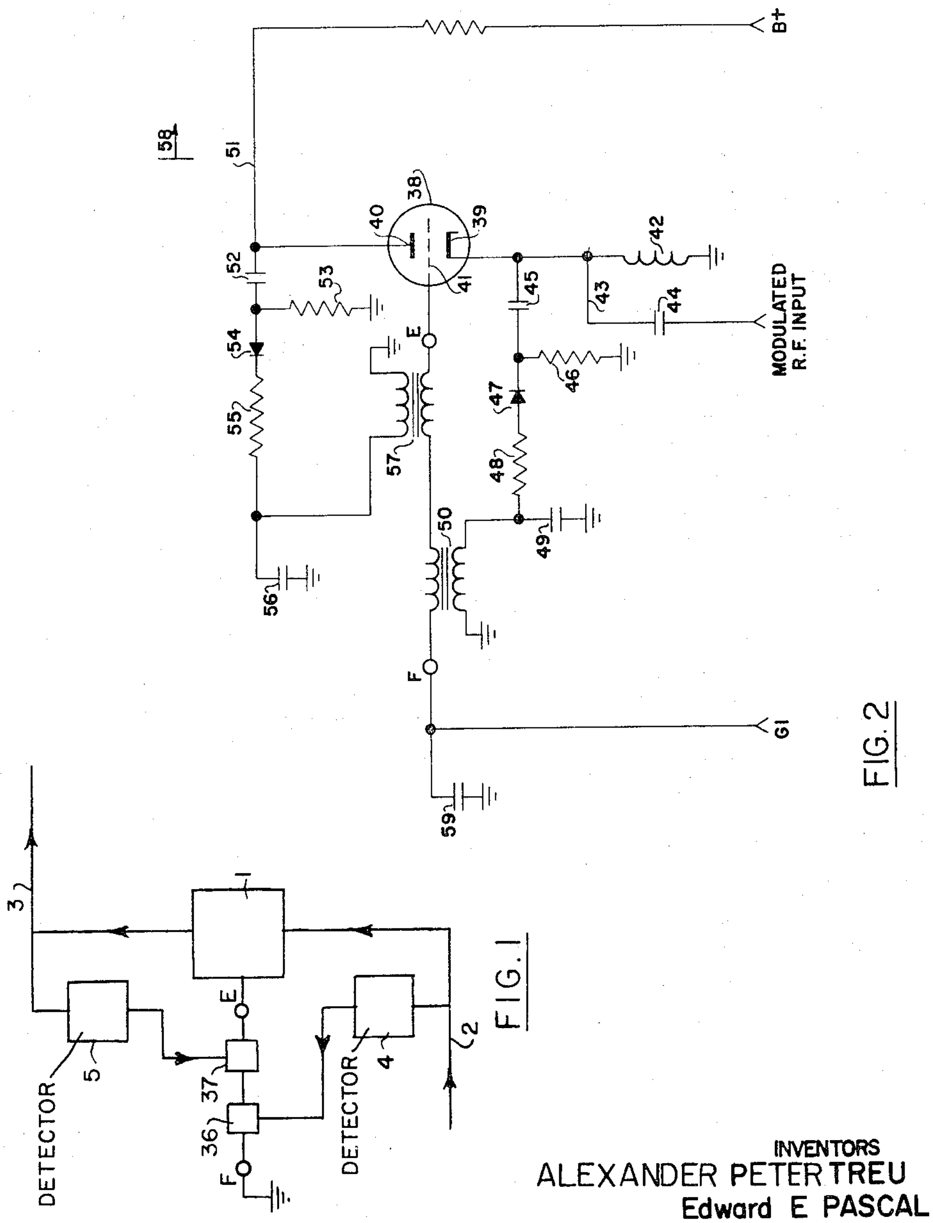
FIG. 1 is a block diagram representation of the basic essence of the invention.
FIG. 2 is a schematic diagram of one embodiment of the invention.

FIG. 1 is a block diagram of a single amplifier stage comprising amplifier valve 1, signal input circuit 2, and signal output circuit 3. A subtracting means comprising passive elements 36 and 37 between points E and F is connected to the amplifier valve 1. A first detecting means 4 connected between the signal input circuit and the passive subtracting means is provided to detect a first sample of the modulation component of a signal which is traversing a signal input circuit 2, and a second detecting means 5 connected between the signal output circuit 3 and the passive subtracting means is provided to detect a second sample of a modulation component of the output signal. Subtraction of the two samples takes place within the subtraction means, and the difference between the two signals is used to modulate the input signal within the single valve 1.

The two samples are subtracted within the subtraction means, and the amplitude of the second sample is reduced so that exact cancellation will occur when the wave forms of the first and second samples are identical.

Provided the circuit elements between the points where the first sample and the second sample are detected have perfectly linear transfer functions, the output signal from the stage will be a replica of the input signal. It may be seen that if this is true, no difference in the samples exists and hence no signal will appear between points E and F and hence no modulation of the input signal within the valve 1 will occur. The amplifier valve may be used to its maximum capabilities with no decrease in gain caused by feedback of either of the detected samples, since they mutually cancel.

However, let us suppose that there is a non-linear circuit element present between the two aforementioned detection points. In this case, the output signal will not be an exact replica of the input signal and a Fourier analysis of the output signal will reveal frequency components which are not present in the input signal. Therefore, the difference between the detected components (being the undesirable generated frequencies) will, in this invention, modulate the signal traversing the single amplifier valve so as to cancel the undesirable generated extraneous frequencies within the single amplifier stage. Therefore, the output signal will be virtually an exact replica of the input signal.

An extremely useful application of my invention is in an amplifier stage used for modulated radio frequency carrier signal, where extreme linearity of amplification is desired. In this case, extreme linearity of the envelope or modulation wave form is important, since if used in a single sideband transmitter, the carrier frequency in one sideband of frequencies will be eliminated prior to transmission. Any undesirable frequency components caused by non-linear operation of the amplifier will generate power-wasting, bandwidth-consuming, and distorting in-band products as well as superfluous sidebands. One useful embodiment of my invention comprises an amplifier stage wherein the active element is a three electrode valve, having a source electrode, a collecting electrode, and a single control electrode for charge-carriers. In this case, the difference signal can be generated without amplification necessary outside the valve, applied to the control electrode, and have the distortion correction modulation effected within the valve. FIG. 2 shows a triode electron tube 38 comprising an anode 40, a cathode 39, and a control grid 41. We have chosen to connect the amplifier in grounded control grid configuration, but it will become obvious to one skilled in the art understanding this invention that a circuit could also be designed for other configurations of the amplifier valve. The principle described below, of course, can also be applied by one understanding this invention to the semiconductor art, and the triode valve comprise a transistor, and either valve may have a grounded cathode or equivalent configuration. I have shown a signal input circuit comprising isolation inductor 42 and conductor 43 connected to cathode 39. The return conductor for the signal input circuit may be, of course, common signal ground and is not shown. We have shown capacitor 44 in the signal input circuit for direct current isolation purposes from the previous stage. However, other signal input circuits may be used within the scope of my invention. A signal output circuit comprising conductor 51 and circuit elements to the right of numeral 58 on the drawing is connected to anode 40. Other output circuits may, of course, be used within the scope of this invention. The control grid 41 is effectively connected to ground for modulating signal frequencies by means of the return lead, not shown, of negative bias source $G_1$ provided for grid 41, and by capacitor 59. The grid 41 may also be bypassed for carrier signal frequencies by a bypass capacitor connected between the grid and ground, not shown. It may be seen that the so-far-described circuit stage would amplify in the normal grounded configuration manner.

According to this embodiment of our invention, we provide a first detecting means for detecting a first sample of the modulation component of the input signal which appears in the signal input circuit. In this case, the first detecting means comprises a half wave detector. For the detector, we have used the combination of elements comprising direct current blocking capacitor 45, connected to the signal input circuit at conductor 43, in series with resistor 46 to ground. A rectifier 47 is connected with one electrode to the junction of capacitor 45 and resistor 46, and the other in series with resistor 48 and then capacitor 49 to ground. Resistor 48 and capacitor 49 comprise a filter which acts in a well known manner to bypass as much of the carrier frequency signal which has traversed the detector as possible. Therefore, if one was to measure the signal appearing across capacitor 49, one would observe a sample of the modulation component of the signal appearing in the signal input circuit. Of course, other detectors and means for detecting a sample of the input signal could be used. The primary of transformer 50 is connected across capacitor 49.

In order to detect the modulation component of the output signal, we have provided a detector connected to the signal output circuit similar in all respects to the detector connected to the signal input circuit. This detector comprises capacitor 52, resistor 53, diode 54, resistor 55, and capacitor 56 connected in the same configuration as the components of the detector connected to the signal input circuit, except that the terminal conductor of capacitor 52 which is not connected to diode 54 is connected to conductor 51 of the signal output circuit 58. The primary of transformer 57 is connected across capacitor 56 to receive the detected signal. A potentiometer may be connected across the transformer in order to reduce the signal from the signal output circuit to an amplitude equivalent to the signal detected from the signal input circuit and applied to transformer 50. The signal applied to transformer 50 therefore comprises the first sample, and the signal applied to transformer 57 is the second sample.

In this embodiment, the secondary windings of transformers 50 and 57 are connected in series between control grid 41 of the electron tube 38 and its source of negative bias $G_1$. The source of negative bias is effectively at ground potential with respect to alternating potentials due to bypass capacitor 59. The transformers are connected in a manner and have such winding turns ratios that the signals appearing across the secondary windings mutually cancel with respect to points E and F, should it be desired to delete the potentiometer. Of course the potentiometer may be used to render the samples equal in amplitude where other turns ratios are desired. Therefore, if a signal is present in the detected component of the output signal which is not present in the detected component of the input signal, they will not cancel, and a difference signal will appear between grid 41 and common signal ground. This difference signal will modulate the flow of charge carriers from the cathode to the anode within electron tube 38. Any distortion products which may be generated between the point at which the first sample of the modulation component of the input signal and the second sample of the modulation component of the output signal are detected are effectively cancelled. Thus the output signal appearing in the signal output circuit and the load circuit elements which appear to the right of numeral 58 in FIG. 2 will be a faithful amplitude reproduction of the input signal. It will be seen that the secondaries of transformers 50 and 57 are connected series so that a signal corresponding to the difference between the two appearing across each secondary will appear between control grid 41 and ground, or points E and F. However, other methods of generating the difference signal may be used within the scope of this invention.

Figure 3:
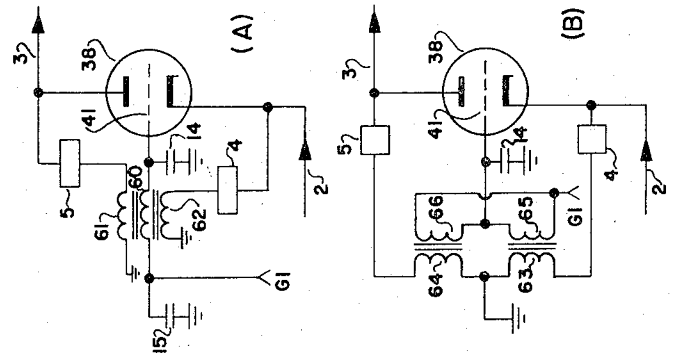
FIG. 3 shows schematically two means to achieve the difference between the two sample signals, as described below.

For instance, two signal subtraction configurations of transformers are shown in FIGS. 3*a* and 3*b*. The transformer shown in FIG. 3*a* comprises primary winding 60, secondary winding 61, and tertiary winding 62. Means for detecting a first sample of the modulation component of the input signal 4 provides the first sample across winding 62, and means for detecting a second sample of the modulation component of the output signal 5 provides the second sample across winding 61. The two signals pass through their respective windings in such a direction as to mutually cancel. Should the signal traversing winding 61 be different from the signal traversing winding 62, the difference between the two will be induced in winding 60, through which the bias for control grid 41 of electron tube 38 is passing. In the same manner as described above, this signal modulates the flow of charge carriers within electron tube 38 in such direction as to cancel the component which forms the difference between the two samples.

FIG. 3*b* shows another method of producing the difference signal using two transformers. The signal produced by the first detection means 4 is applied across the primary 63 of the first transformer, and the signal produced by the second detection means 5 is applied across the primary 64 of the second transformer. Bias for the control electrode 41 of electron tube 38 is applied through the secondaries 65 and 66 of the first and second transformers respectively which are connected in parallel. Thus an alternating potential appearing across the primary of transformer 65 which is identical but opposite in phase with a signal appearing across the primary winding 66 will mutually cancel, and the bias potential $G_1$ will be applied to the grid 41 unimpeded. However, if a difference between the two aforementioned signals is present, this difference signal will modify the bias and modulate the charge carriers traversing electron tube 38 in the method described above. Thus, it may be seen that various means of passive subtraction of the two detected signals may be designed within the scope of this invention.

Figure 4:
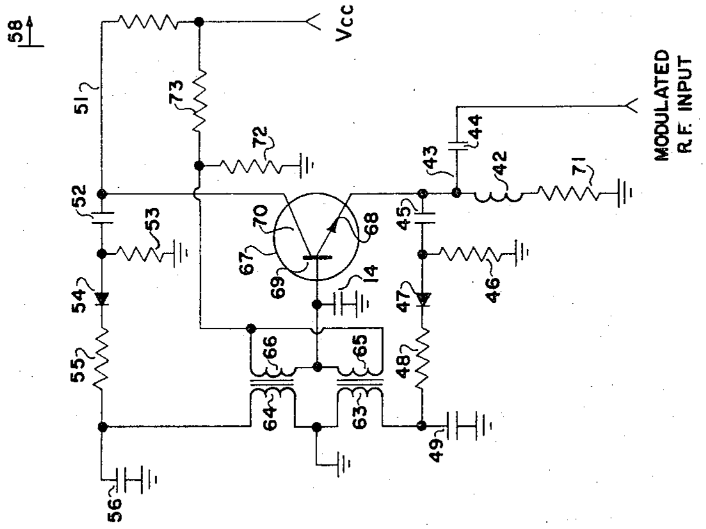
FIG. 4 is a schematic diagram of another embodiment of my invention, using a transistor amplifier valve.

As was mentioned above, the fact that our invention may be applied to a valve comprising one control electrode makes it applicable to transistor amplifiers. In this regard, we have shown an embodiment of our invention in FIG. 4 with a transistor connected in the grounded base configuration. For this description, we have shown the method of subtraction of the sample of the output signal and the sample of the input signal as in FIG. 3*b*. However, the biasing networks for the transistor circuit shown in FIG. 4 will be slightly different from FIG. 3*b* because the valve in this case is a transistor.

Shown is transistor 67 having emitter 68, base 69, and collector 70. As in the embodiment of FIG. 2, a signal input circuit comprising conductor 43 and emitter isolation inductor 42 is connected to emitter 68. Bias resistor 71 is connected between the other end of inductor 42 and ground. A signal output circuit comprising conductor 51 and load 58 is connected to collector 70. As described previously and connected in similar form, first detection means for detecting a first sample of the modulation component of the input signal comprising capacitor 45, resistor 46, diode 47, resistor 48, and capacitor 49 is connected between the signal input circuit and the primary 63 of the first transformer. Also as described above, second detection means for extracting a second sample of the modulation component of the output signal comprising capacitor 52, resistor 53, diode 54, resistor 55, and capacitor 56 is connected between the signal output circuit and the primary of the second transformer. Secondary windings 65 and 66 are connected in parallel configuration so that the signals appearing thereacross are opposing, with one end of the pair connected to the base 69 of transistor 67 and the other end to resistor network 72 and 73 which supply the proper bias potential for transistor base 69 from a source of potential $V_{cc}$. Thus, it may be seen that the alternating current function of this transistor circuit is analogous to that of the electron tube circuit of FIG. 2. Indeed, it may be seen that any amplifier valve achieving the same functions as those described above may be used.

In the present state of the art, circuits involving reactive components, such as the transformers used in various embodiments, impose frequency bandwidth limitations on a signal traversing therethrough. In this regard, transformers efficient in passing of say, audio frequency, are inefficient at radio frequencies. Since an audio frequency is likely to be the modulation component of the radio frequency carrier signal, and since it is the audio frequency modulation component which is reproduced in a receiver, this is the most important component of the signal to be amplified, as it carries the intelligence. Therefore in the embodiment shown for the concentration of the correction to the modulation component, the transformers used will be those designed most efficiently for modulation frequency signals. However, if the input signal comprises only single frequencies, the transformers can be designed to transmit any distortion frequency band of interest. In addition, those understanding our invention and having a specific requirement for its application can design other subtraction networks than the transformer configurations shown, other means for extracting said samples of the input and output signals, and other circuit configurations of the amplifier valve, within the scope of our invention.

It will be seen by one understanding our invention that we have been able to accomplish efficient distortion cancellation due to the absence of complicated circuitry which causes phase differences between the sample of the input signal and the sample of the output signal, and because the complete cancellation, modulation, and amplification function is performed within a single stage. we have provided a circuit for reducing distortion within a single amplifier stage having a greatly reduced number of elements from the prior art, thus achieving an improvement in economy. In addition, because of our improved distortion reduction factor, less amplifier power is wasted, since distortion signal components are greatly reduced, and greater economy of bandwidth is achieved.

In addition, since we have provided embodiments of our invention which can be used with amplifier valves having single control electrode, our distortion reduction technique can be applied to transistor as well as triode electron tube circuits.

What is claimed is:

1. A circuit for reducing distortion within a single amplifier stage comprising:
(a) an amplifier valve,
(b) a signal input circuit to which an input signal may be applied, and a signal output circuit from which an output signal may be received, connected to the amplifier valve,
(c) subtracting means within said single stage,
(d) a first detecting means connected to the signal input circuit and the subtracting means for detecting a first sample of a modulation component of the input signal and applying it to the subtracting means,
(e) a second detecting means connected to the signal output circuit and the subtracting means for detecting a sample of the modulation component of the output signal, and applying it to the subtracting means; said second sample being of such amplitude that its effect in the subtracting means is substantially equal to the effect of the sample of the input signal in the subtracting means in the absence of distortion which may be caused by non-linearity within a circuit element which may be connected in the signal path between the signal input circuit and the signal output circuit, and not equal to the effect of the sample of the input signal in the subtracting means in the presence of distortion caused by said non-linearity, and
(f) modulating means within the amplifier valve for modulating a signal, traversing the valve from the input circuit to the output circuit, with any difference between the effects of said samples in such manner as to reduce distortion of the input signal,
(g) said subtracting means comprising an arrangement of passive circuit elements connected to the modulating means.

2. A circuit for reducing distortion as defined in claim 1 wherein the circuit element causing distortion is the amplifier valve.

3. A circuit for reducing distortion as defined in claim 1 wherein the single amplifier valve comprises a charge carrier source electrode, a charge carrier collecting electrode, and a charge carrier control electrode; a signal comprising the difference between said first sample and said second sample as derived in said subtracting means being applied to said control electrode.

4. A circuit for reducing distortion as defined in claim 3 wherein the first and second detecting means comprise means for applying said first and second samples virtually equal in amplitude to said subtracting means.

5. A circuit for reducing distortion as defined in claim 3 wherein the subtraction means comprises a circuit arrangement of the windings of a first and second transformer, the primary winding of one transformer being connected to the first detecting means, and the primary of the second transformer being connected to the second detecting means; the windings of the transformers being connected so that their respective polarities are in such direction that a signal corresponding to the difference between the two samples applied to their respective primaries is produced across said arrangement, and is applied to said control electrode.

6. A circuit for reducing distortion as defined in claim 3 wherein the subtracting means comprises a transformer having a primary, secondary, and tertiary winding, the secondary winding being connected between the control electrode and signal ground, the primary winding being connected to the second detecting means and effective signal ground, and the tertiary winding being connected between the first detecting means and effective signal ground; the polarities of the primary and tertiary windings being such that signals induced therefrom into the secondary winding will be of mutually opposite polarity, thus producing a difference signal which is applied to said control electrode.

7. A circuit for reducing distortion as defined in claim 3 wherein a signal in the signal input circuit comprises an amplitude modulated carrier signal, and the first and second detecting means comprise means for detecting said samples of the modulation components of the input and output signals respectively.

8. A circuit for reducing distortion as defined in claim 5 wherein the secondary windings are connected in parallel, with one junction point of the secondary windings being connected to the control electrode, the other junction of the secondary windings being connected to effective signal ground, the primary of one transformer being connected between the first detecting means and effective signal ground, and the other primary winding being connected between the second detecting means and effective signal ground, the polarities of the transformer windings being such that a signal corresponding to the difference between the two signals which would appear across each single secondary winding appears across their combination.

9. A circuit for reducing distortion as defined in claim 3 wherein:
(a) the signal input circuit comprises a signal isolation means for the input signal connected between said source electrode and ground, and adapted to allow direct current to flow between the source electrode and ground;
(b) the means for detecting said first sample comprises half wave modulation component detection means connected to said signal input circuit and adapted to allow said first sample of the modulation component of the input signal to traverse therethrough,
(c) the signal output circuit comprises an output load connected to said collecting electrode of said valve, and comprising
(d) means connected to the control electrode for applying said first sample to the control electrode, in phase with the modulation component of the input signal in the signal input circuit, so as to modify a bias potential which may be connected thereto; the modulation means comprising said control electrode,
(e) means for detecting said second sample comprising half wave modulation component detection means connected to the output load and adapted to allow said second sample of the modulation component of the output signal to traverse therethrough,
(f) means for applying a portion of said sample of the modulation component of the output signal, virtually equal in amplitude to the sample of the modulation component of the input signal, to the subtracting means.

10. A circuit for reducing distortion within a single amplifier stage comprising:
(a) a single amplifier valve having a source electrode for charge carriers, a collecting electrode for charge carriers, and a control electrode for charge carriers,
(b) a signal input circuit comprising an inductor connected between source electrode and ground, and a pair of conductors connected to the source electrode and ground respectively,
(c) a half wave detection circuit comprising a direct current blocking capacitor with one end connected to the source electrode, a resistor connected between the other end of the capacitor and ground, a diode having its anode connected to the junction between the resistor and the capacitor, a second resistor having one end connected to the cathode of the diode, a bypass capacitor of such value as to bypass higher frequencies than the modulation component of an input signal which may be traversing the signal input circuit, connected between the other end of the second resistor and ground, and a first transformer comprising a primary and secondary winding having its primary winding connected between ground and the junction of the second resistor and second capacitor, (d) the secondary of the transformer being connected between the control electrode of the amplifier valve and a bias network therefor, and a third capacitor of such value as to pass frequencies higher than the modulation component of an input signal which may be traversing the signal input circuit, connected between the control electrode and ground, (e) a load connected to the collecting electrode of the valve, (f) a second detection circuit, comprising a fourth capacitor having one end connected to the collecting electrode, a third resistor connected between the other end of the fourth capacitor and ground, a second diode having its anode connected to the junction of the fourth capacitor and third resistor, a fourth resistor having one end connected to the cathode of the second diode, a fifth capacitor connected between the other end of the fourth resistor and ground, (g) a second transformer having its primary winding connected between ground and the junction of the fourth resistor and fifth capacitor, the secondary winding of the second transformer being connected in parallel with the secondary of the first transformer, and a source of bias for the control electrode being connected through the secondary windings to the control electrode.

11. A circuit for reducing distortion as defined in claim 10 wherein the amplifier valve comprises an electron tube having a cathode, anode, and a control grid as the source electrode for charge carriers, collecting electrodes for charge carriers, and control electrodes for charge carriers respectively.

12. A circuit for reducing distortion as defined in claim 10 wherein the amplifier valve is a transistor having an emitter, a collector, and a base as the source electrode for charge carriers, collecting electrode for charge carriers and control electrode for charge carriers respectively.

13. A circuit for reducing distortion as defined in claim 5 wherein the secondary windings are connected in series, with one free end of the joined secondary windings being connected to the control electrodes, and the other free end of the joined secondary windings being connected to effective signal ground, the primary of one transformer being connected between the first detecting means and effective signal ground, and the other primary winding being connected between the second detecting means and effective signal ground, the polarities of the transformer windings being such that a signal corresponding to the difference between the two signals which would appear across each single secondary winding appears across their combination.

14. A circuit for reducing distortion as defined in claim 3 wherein the amplifier valve comprises an electron tube having a cathode, anode, and control grid as the source electrode for charge carriers, collecting electrodes for charge carriers, and control electrodes for charge carriers respectively.

15. A circuit for reducing distortion as defined in claim 3 wherein the amplifier valve is a transistor having an emitter, a collector, and a base as the source electrode for charge carriers, collecting electrode for charge carriers and control electrode for charge carriers respectively.

No references cited.

ROY LAKE, *Primary Examiner.*

E. C. FOLSOM, *Assistant Examiner.*